INVENTORS,
JACK AVINS &
JACK CRAFT
Eugene M. Whitacre
ATTORNEY

Sept. 16, 1969 J. AVINS ETAL 3,467,909

INTEGRATED AMPLIFIER CIRCUIT ESPECIALLY SUITED FOR HIGH FREQUENCY OPERATION

Filed June 29, 1967 2 Sheets-Sheet 2

INVENTOR
JACK AVINS & JACK CRAFT

BY Eugene M. Whitacre

ATTORNEY

United States Patent Office 3,467,909
Patented Sept. 16, 1969

3,467,909

INTEGRATED AMPLIFIER CIRCUIT ESPECIALLY SUITED FOR HIGH FREQUENCY OPERATION

Jack Avins, Princeton, and Jack Craft, Somerville, N.J., assignors to Radio Corporation of America, a corporation of Delaware Filed June 29, 1967, Ser. No. 650,088
Int. Cl. H03f 3/42
U.S. Cl. 330—19 9 Claims

ABSTRACT OF THE DISCLOSURE

A signal translating stage especially suitable for direct coupled cascade connection in an integrated circuit device includes an emitter coupled amplifier direct current driving an emitter follower, with first means for preventing the output capacitance of the stage from degrading its performance at high frequencies and with second means for maintaining the input and output direct current potentials of the stage substantially equal.

This invention relates to signal translating systems and, more particularly, to amplifier-limiters which can be economically fabricated using integrated circuit techniques.

As used herein, the term integrated circuit refers to a unitary or monolithic semiconductor device which is the equivalent of a network of interconnected active and passive circuit elements. Various problems have presented themselves in the design of amplifier circuits to be formed in an integrated circuit device. For example, in cascade connected resistance-capacitance amplifiers, the use of coupling capacitors between successive stages is objectionable in some applications. For one thing, the coupling capacitor occupies considerable area on the integrated circuit device, even for a relatively small amount of capacitance. The small coupling capacitance limits not only the low frequency response of the amplifier, but also the high frequency response and, therefore, the gain at the desired signal frequency; and the parasitic shunt capacitance which occurs in integrated circuit capacitor structures limits the high frequency response still further. In addition to the foregoing, limitations in the processing techniques presently used for forming capacitors are such that the resultant capacitors may be a substantial source of trouble due to shorting between the plates thereof.

In cascade connected direct coupled amplifiers, the direct voltage appearing at the output electrode of one stage comprises the voltage which is applied to the succeeding stage. As a result, complicated biasing networks are used to establish the desired operating point for each of the cascaded stages. In addition, direct current (D-C) feedback must be provided for operating point stabilization. Where substantial gain is to be effected in a single integrated circuit device, the phase shifts within the feedback loop are such as to increase the likelihood of circuit instability.

An amplifier stage embodying the invention includes three transistors. A first and second of the transistors are connected as an emitter coupled amplifier, with the first transistor operating in the base-input, common-collector mode, and with the second transistor operating in the emitter-input, common-base, collector-output mode. The third transistor, connected as an emitter follower, is directly coupled to receive the signals developed at the collector electrode of the second transistor.

In accordance with an embodiment of the invention, a pair of resistors are serially connected in the emitter electrode circuit of the third transistor. One resistor functions as the load across with the output voltage of the amplifier stage is developed, while the other resistor serves to isolate the emitter electrode of the third transistor from the output capacitance of the amplifier in order to improve its high frequency response. A third resistor is connected to the collector electrode of the second transistor while a fourth resistor is connected in common with the emitter electrodes of the first and second transistors. These latter resistors are proportioned so as to maintain the junction of the first and second resistors at substantially the same direct current potential as is applied to the base electrode of the first transistor. More particularly, these resistors are selected so that the quiescent direct current potential established at the collector electrode of the second transistor exceeds the difference between the value of the operating supply for the stage and the quiescent direct current potential established at the emitter electrode of the second transistor by an amount substantially equal to the voltage developed across the third transistor emitter electrode isolating resistor. When so selected, these resistors establish a quiescent direct current potential at the collector electrode of the second transistor which reverse biases the collector-base junction thereof by an amount substantially equal to the sum of the forward base-to-emitter voltage of the third transistor and the voltage developed across its emitter electrode isolating resistor.

As will become clear hereinafter, such an amplifier stage is similar to one described in the pending application entitled "Signal Translating System," Ser. No. 396,140, filed Sept. 14, 1964, now Patent No. 3,366,889. Several such stages can also be cascaded in a manner analogous to that described therein to form the intermediate frequency (IF) amplifier of a frequency modulation (FM) radio receiver, for example.

In accordance with another embodiment of the invention, the fourth resistor of the amplifier stage is replaced by a constant current transistor having a fifth resistor coupling its base electrode to the operating potential supply. The third and fifth resistors are proportioned in much the same manner as the third and fourth resistors so as to maintain the input and output direct current potentials of the stage substantially equal.

The novel features which are considered to be charateristic of this invention are set forth with particularity in the claims. The invention itself, however, both as to its organization and method of operation as well as objects and advantages thereof, will best be understood from the following description when read in connection with the accompanying drawings in which:

Figures 1, 2, 4:
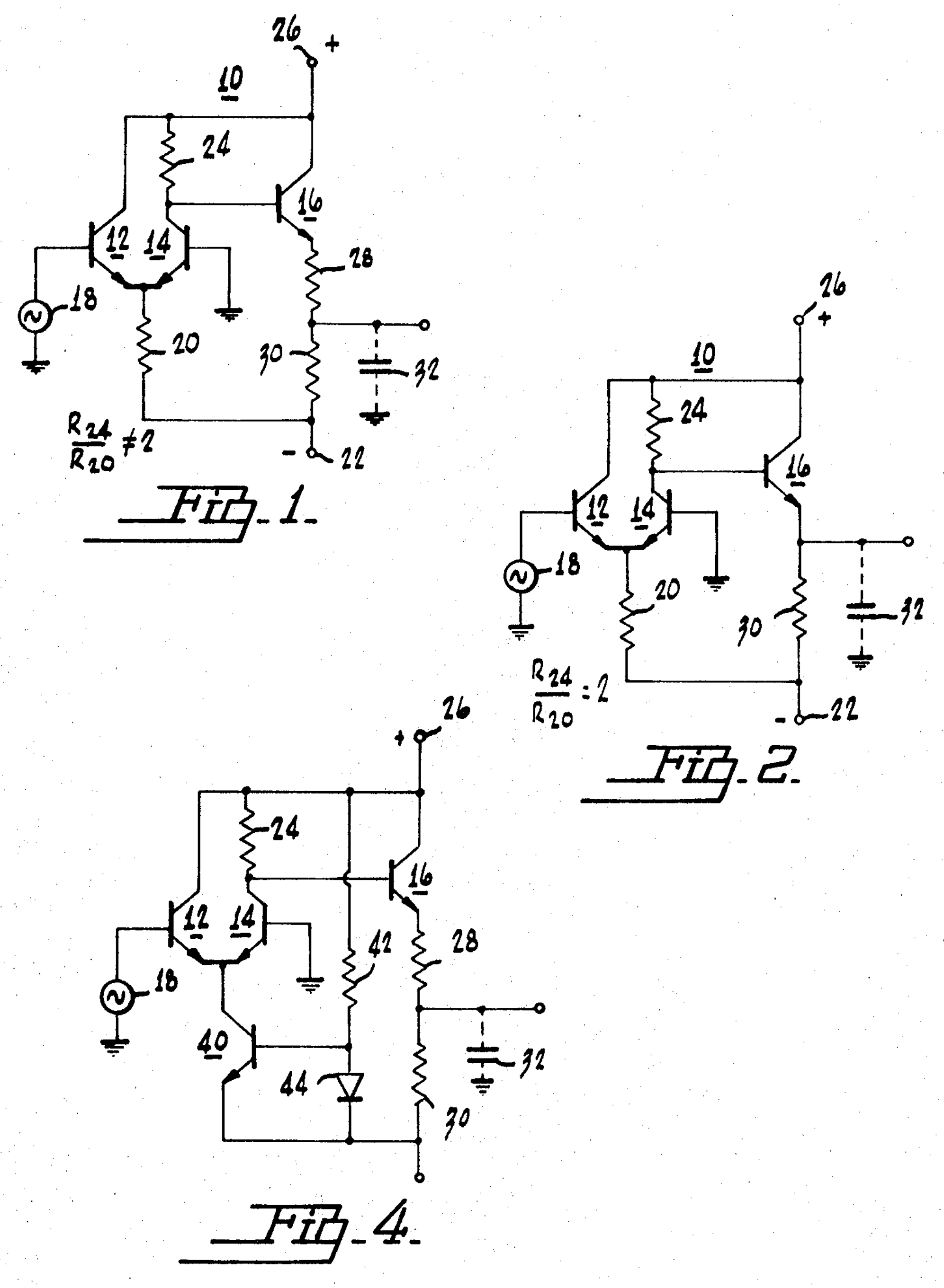
FIGURE 1 is a schematic circuit diagram of an amplifier stage embodying the invention.
FIGURE 2 is a schematic circuit diagram of an amplifier stage described in the Ser. No. 396,140 application which is helpful in understanding the present invention.
FIGURE 4 is a schematic circuit diagram of another amplifier stage embodying the invention.

Referring now to FIGURE 1, the schematic circuit diagram there shown represents a direct current amplifier stage 10 which may comprise a basic building block for integrated circuits. The amplifier stage 10 includes three transistors 12, 14 and 16 connected to provide an emitter coupled amplifier circuit driving an emitter follower circuit.

The emitter coupled amplifier circuit includes the transistor 12 connected in the common collector configuration, driving the transistor 14 which is connected in the common-base configuration. Signals from a source 18, not necessarily included in the integrated circuit device, are applied to the base electrode of the transistor 12. Coupling between the transistors 12 and 14 is effected by the direct emitter connection and the resistor 20, which is connected in common between the emitter electrodes of the transistors 12 and 14 and the negative terminal 22 of an operating potential supply. The base electrode of transistor 14 is connected to a point of reference potential, such as ground. A load resistor 24 is connected between the collector electrode of transistor 14 and a positive terminal 26 of the operating potential supply. Amplified signals developed across the load resistor 24 are directly applied to the base electrode of the transistor 16, which is connected in an emitter follower circuit, with a pair of serially connected resistors 28 and 30 connected to the emitter electrode thereof. Output signals from the stage 10 are developed across the resistor 30 which functions as the load for the stage. The resistor 28 serves to isolate the emitter electrode of the transistor 16 from the output capacitance 32 of the amplifier 10, shown in dotted lines.

The operating potential source, not shown, comprises a three terminal supply providing symmetrical positive and negative voltages relative to ground. By way of example, the voltages at the terminals 26 and 22 may be plus 2.1 volts and minus 2.1 volts respectively, with ground as a reference.

In the present example, the emitter coupled amplifier circuit is balanced for symmetrical operation by maintaining the base electrodes of the transistors 12 and 14 at substantially the same (ground) potential. Further amplifier stages of the same circuit configuration as the amplifier stage 10 can be directly driven by that stage if the D-C voltage at the junction of the emitter follower resistors 28 and 30 is held at ground potential. In such case, the emitter coupled amplifier of succeeding stages will be balanced since the base electrodes of the first transistor thereof will be at D-C ground potential.

As so far described, the amplifier stage 10 of FIGURE 1 is very similar to the amplifier stage described in the pending application, Ser. No. 396,140. That stage is reproduced in FIGURE 2 of this specification, wherein corresponding numbers are used to designate similar components. A comparison of the two amplifier stages will show that the amplifier stage of this application (FIGURE 1) includes a resistor 28 in the emitter circuit of the emitter follower transistor 16 which is not shown in the 396,140 application (FIGURE 2). In addition, the 2:1 resistance ratio maintained between the resistors 24 and 20 in that pending application to provide stabilization in the presence of temperature and/or supply voltage variation is varied somewhat in this case. The reasons for this change will become clear from the following description.

Figure 3:
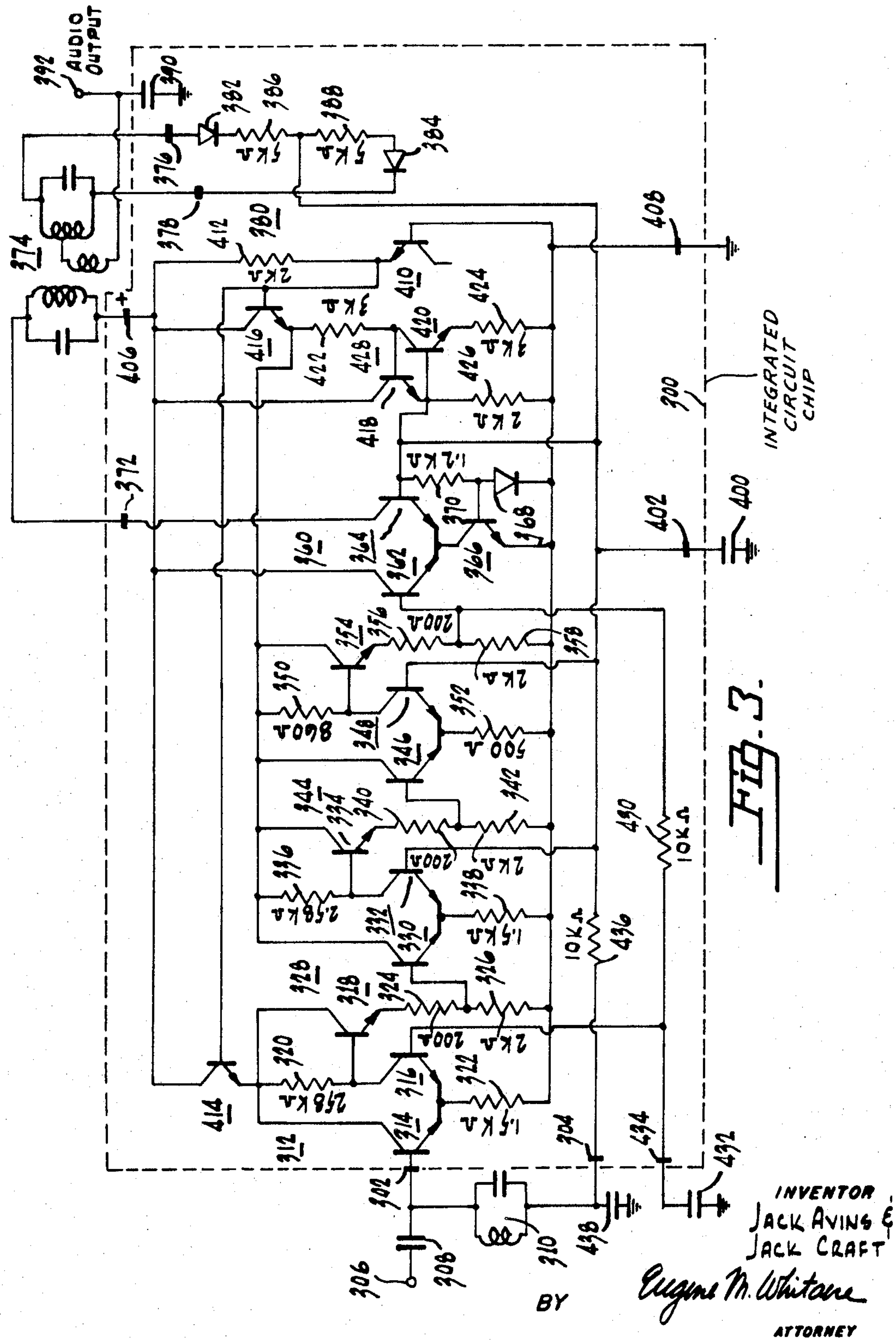
FIGURE 3 is a schematic circuit diagram of an angle modulated wave processing channel for frequency modulation radio receivers which may be incorporated in an integrated circuit device.

Referring to FIGURE 3, there is shown a schematic circuit diagram of an angle modulated wave processing channel for FM radio receivers which may be incorporated in an integrated circuit device. The dotted box 300 schematically illustrates a monolithic semiconductor circuit chip for use as the IF amplifier of the receiver. The chip has a plurality of contact areas about the periphery thereof, through which connections to the circuit on the chip may be made. For example, the chip 300 has a pair of contact areas 302 and 304 which are coupled to a source of FM waves. As to physical dimensions, the chip 300 may be of the order of 60 mils x 60 mils, or smaller.

Frequency modulated signals from a suitable source, such as the mixer stage of an FM radio receiver, are applied between terminal 306 and ground, and are coupled through a capacitor 308 to a resonant circuit 310 which is tuned to the 10.7 mHz. IF signal. The resonant circuit 310 and the coupling capacitor 308, in the present example, are external to the chip but are coupled thereto through the contact areas 302 and 304.

The contact area 302 is directly coupled to a first amplifier stage 312 including three transistors 314, 316 and 318. The first two transistors 314 and 316 are connected by resistors 320 and 322 to provide an emitter coupled amplifier, and the third transistor 318 is connected by resistors 324 and 326 as an emitter follower. The output signal developed by the amplifier stage 312 appears at the junction of resistors 324 and 326.

The amplifier stage 312 is directly coupled to a similar amplifier stage 328 which also includes three transistors 330, 332 and 334. The first two transistors 330 and 332 are also connected by a pair of resistors 336 and 338 to form the emitter coupled amplifier construction while the third transistor 334 is also connected as an emitter follower, by resistors 340 and 342. The output signal from this stage is developed at the junction of resistors 340 and 342.

The amplifier stage 328 is directly coupled to a similar such stage 344. The emitter coupled amplifier of the stage 344 includes the transistors 346 and 348, the load resistor 350 and the common emitter resistor 352. The emitter follower includes the transistor 354 and the serially connected resistors 356 and 358, the junction of which comprises the output point of the amplifier stage 344.

Output signals from the amplifier stage 344 are developed across the resistor 358 and applied to a high level limiter stage 360 including transistors 362, 364 and 366, a diode 368 and a resistor 370. The transistor 366 functions as a constant current source for the limiter stage 360, and is temperature compensated by the diode 368 in a known manner. The transistor 364 portion of the stage 360 is connected through a contact area 372 to drive the primary winding of a discriminator transformer 374. The secondary winding of the discriminator transformer 374 is connected through a pair of contact areas 376 and 378 to the remainder of the discriminator circuit 380. The discriminator circuit 380 is balanced to provide a direct output voltage at the centertap of the secondary winding transformer 374 which does not vary with signal level.

The discriminator circuit 380 is of the type described in the pending application entitled "Signal Translating System," Ser. No. 531,652, filed Feb. 28, 1966, now Patent No. 3,383,607. More particularly, the circuit 380 is of the form of a ratio detector but without the large non-integratable capacitor normally used to obtain peak rectification. The oppositely poled rectifier devices of the discriminator circuit 380 are shown by the reference numerals 382 and 384 while the distributed capacitance of the integrated load resistor 386 and 388 provide filtering of the signal frequency and its harmonics.

The demodulated signals developed by the discriminator 380 are coupled by means of the tertiary winding of the discriminator transformer 374 to a de-emphasis capacitor 390 and to an audio frequency output terminal 392.

The circuit of FIGURE 3 differs from that of FIGURES 1 and 2 in that the operating potential supply is unbalanced. In other words, all of the voltages in the circuit are positive relative to ground. To this end, the positive terminal of a D-C supply source (which may be subject to some variations) is connected to the contact area 406, and the grounded negative terminal is connected to the contact area 408. The unregulated voltage between the contact areas 406 and 408 is directly applied to the transistor 362 of the high level stage 360.

The supply voltage variation is regulated by the emitter-base breakdown voltage of a transistor 410, which is connected to the contact area 406 via a resistor 412 and whose collector electrode is left unconnected. Transistors 414 and 416, connected to the contact area 406 and to the transistor 410, serve as emitter followers to isolate the regulated voltage fed to the amplifier stage 312 from that fed to the stages 328 and 344.

A pair of transistors 418 and 420 and three resistors 422, 424 and 426 are also included in the circuit of FIGURE 3, and comprise a bias potential supply 428 for the amplifier stages 312, 328 and 344. This supply 428 is of the type disclosed in the pending application, Serial No. 510,307, filed November 29, 1965, and entitled "Electrical Circuit," now Patent No. 3,383,612. In a manner analogous to that described therein, the supply 428 develops a voltage across resistor 426 which is substantially equal to one-half the value of the supply voltage at the end of resistor 422 remote from the collector electrode of transistor 420 and which is independent of temperature and supply voltage variations. Operating point stability of the amplifier stages 312, 328 and 344 is maintained by use of direct current feedback through resistor 430 around those three stages, with a bypass capacitor 432 connected to the resistor 430 via contact area 434. The limiter stage 360 is then held automatically at the proper operating point because the feedback around the amplifier stages 312, 328 and 344 holds the voltage at the base electrode of the transistor 362 at one-half the aforementioned supply voltage. The limiter stage 360 is thus balanced without being in the feedback loop. This is desirable because the tendency toward oscillation with the feedback loop is reduced by keeping the number of stages as low as possible. Proper bias voltage for the limiter stage 360 is made essentially independent of transistor current gain through the use of a resistor 436, connected in the base electrode return of transistor 314 and equal in value to the resistor 430 connected in the base electrode return of transistor 316. Bypass capacitors 400 and 438 are connected to the resistor 436 by means of the contact areas 402 and 304.

The circuit arrangement described in FIGURE 3 comprises a four stage amplifier suitable for use in an FM radio receiver. Aside from its additional stage, it is similar in construction and operation to the three stage amplifier configuration shown in the pending Ser. No. 396,140 application for use in the sound channel of an intercarrier television receiver. The need for this extra stage of amplification results from the fact that the input signal supplied to the amplifier is of lower signal level in the FM radio receiver, where it is supplied at 10.7 mHz. from the mixer stage, than in the television receiver, where it is supplied at 4.5 mHz. from either the video detector or video amplifier. The FIGURE 3 arrangement also uses a different bias supply configuration and further differs in that the amplifier stages which precede the high level limiter stage are of the form illustrated in FIGURE 1, whereas in the 396,140 application, they are of the form shown in FIGURE 2. The reason for this will now be considered.

As can be seen from the foregoing description, the three stage amplifier configuration of the Ser. No. 396,-140 application will generally be inadequate in an FM radio receiver environment—a fourth stage of amplification will be required. Assume for the moment that the circuit arrangement of FIGURE 3 represents such a four stage amplifier of the Ser. No. 396,140 variety, i.e., that the resistors 324, 340, and 356 in the stages 312, 328 and 344, respectively, are omitted and that the ratios of resistors 320 and 322, 336 and 338, and 350 and 352 in those stages are all of a 2:1 value. Such an arrangement has been constructed and found to exhibit a performance somewhat less than the outstanding performance observed with the three statge amplifier in the television receiver environment of the 396,140 pending application, and expected when a fourth stage was added for use in the FM radio receiver environment. This occurrence has been traced to the fact that at the 10.7 mHz. frequency of the FM receiver, the output capacitance of each of the amplifier stages constructed as per FIGURE 2 herein, has prevented the emitter follower portion of the stage from being cut-off on a negative going signal swing. The emitter follower response on positive going signal swings has been observed to be unaffected by the increase in operating frequency, so that the amplifier characteristic thus exhibited by the emitter follower is asymmetrical in nature. This asymmetry causes a rectification component to be undesirably developed in FIGURE 3 which becomes progressively greater as it is DC coupled to, and amplified by, the latter stages of the amplifier chain. That amplified component is additionally fed back by resistor 430 to the base electrode of transistor 316 in the amplifier stage 312, and produces an overall effect of impairing the AM rejection characteristic of the FM detection, particularly for very high downward amplitude modulations.

However, by isolating the emitter follower transistor of each amplifier stage from its output capacitance, as shown in FIGURES 1 and 3, the charge and discharge time constants exhibited by the stage becomes more nearly symmetrical, thereby reducing the magnitude of the rectified D-C component. This degeneration thus removes the distributed capacitance from across the emitter follower transistor and improves the AM rejection at high frequencies.

One further point requires consideration. As described in the Ser. No. 396,140 application, by making the emitter-coupled amplifier load resistor of each stage to be twice the value of its common emitter resistor, a D-C voltage will be developed across the emitter follower output resistor which will be equal in value to that applied to the input base electrode of the emitter coupled pair. That D-C voltage, in addition, will be stabilized against temperature changes and power supply variations. In such instance, the D-C voltage at the collector electrode of the second transistor of the emitter coupled amplifier is approximately 0.7 volt greater than that output voltage, the 0.7 volt drop representing the base to emitter voltage of the emitter follower transistor. It will be noted, therefore, that the addition of the isolating resistor in the amplifier stages shown in FIGURE 3 thus requires an increase in the D-C voltage at that collector electrode in order to maintain the same D-C voltage across the output resistor so that cascading of the stages is possible. This is accomplished in the amplifier stages of FIGURES 1 and 3 by decreasing the value of the emitter coupled amplifier load resistor, and therefore the above mentioned resistor ratio, until the resulting increase in D-C voltage at the collector electrode of the second transistor in the amplifier stage offsets the added voltage drop across the isolating resistor of the stage. The improvement in AM rejection that results has been found to more than counterbalance the slight dependence on temperature and supply voltage which results due to the departure from the 2:1 resistor ratio used in the amplifier stage of the 396,140 pending application.

In the amplifier stage 344 of FIGURE 3, it will be noted that the ratio of the emitter coupled amplifier load resistor 350 to its common emitter resistor 352 is 1.72. The same ratio is maintained for the corresponding resistors 336 and 338 in the stage 328, and for the resistors 320 and 322 in the stage 312. The absolute values for those latter groups of resistors, however, have each been increased by a factor of three, in order to reduce the amount of current drawn by the stages 312 and 328. Employing lower value resistors in the amplifier stage 344, where the undesired rectification is more likely to occur, proves advantageous in lessening the effect of the output capacitance on the emitter follower signal swing.

The precise resistor ratio to be employed in the emitter coupled amplifier in order to offset the additional D-C voltage drop due to the emitter follower isolating resistor can be determined from the expression:

$$\frac{R_L}{R_C}=2\left[1-\frac{R_I}{R_O}\left(\frac{E_R}{E_R-V_{be_3}}\right)\right] \tag{1}$$

where $R_L$=the resistance value of the emitter coupled amplifier load resistor;

$R_C$=the resistance value of the emitter coupled amplifier common emitter resistor;

$R_I$=the resistance value of the emitter follower isolating resistor;

$R_O$=the resistance value of the emitter follower output resistor;

$E_R$=the quiescent direct current potential existing at the base electrodes of the emitter coupled amplifier transistors; and $V_{be_3}$=the forward base-to-emitter voltage of the emitter follower transistor, which equals 0.7 volt when the transistor is fabricated in a monolithic silicon integrated circuit structure.

The resistor ratio can also be determined from the expression:

$$\frac{R_L}{R_C}=2\left[1-\frac{\Delta V}{E_R-V_{be_3}}\right] \qquad (2)$$

where ΔV=the voltage drop developed across the emitter follower isolating resistor, since:

$$\frac{\Delta V}{E_R}=\frac{R_I}{R_O} \qquad (3)$$

It will be noted that the increase in D-C voltage required at the collector electrode of the second transistor of the emitter coupled amplifier is in a direction to prevent bottoming in that stage. This effectively reduces any harmonic radiation generated by the amplifier stage and further improves the AM rejection of the FM detection. With an unregulated voltage of plus 5 volts applied to the contact area 406 in FIGURE 3, and with the component values illustrated, the quiescent D-C voltage developed at the output terminal of each amplifier stage is approximately 2.1 volts. It will be noted that this is the same D-C voltage established at the input base electrode of the stage by the operating supply 428 and the feedback resistors 430 and 436.

Referring now to FIGURE 4, there is shown a modified form of direct current amplifier embodying the present invention. Corresponding numbers are used throughout to designate components which are similar to those in the amplifier stage of FIGURE 1. A comparison of the two stages will reveal that the common emitter resistor 20 of the FIGURE 1 stage is here replaced by the emitter-collector path of a constant current transistor 40 whose base electrode is coupled by means of a resistor 42 to the positive supply terminal 26. A diode 44 is further coupled across the emitter-base junction of the transistor 40 to provide temperature compensation. The forward voltage across that junction substantially equals the corresponding voltage across the emitter-base junction of the transistor 16.

As with the amplifier stages of FIGURES 1 and 3, the amplifier stage of FIGURE 4 will develop substantially equal input and output direct current potentials in the presence of the emitter follower isolating resistor 28 by proper selection of the emitter coupled amplifier resistors employed. More particularly, this relationship will be maintained if:

$$\frac{R_L}{R_B}=2\left[1-\frac{E_R\left(1+\frac{R_I}{R_O}\right)}{E-V_{be_3}}\right] \qquad (4)$$

where $R_B$=the resistance value of the emitter coupled amplifier resistor 42;

E=the direct current potential applied to the supply terminal 26; and where $R_L$, $E_R$, $R_I$ and $R_O$ are as previously defined. Stated in terms of the voltage drop ΔV developed across the emitter follower isolating resistor $R_I$, the direct current potentials will be maintained if:

$$\frac{R_L}{R_B}=2\left[1-\frac{E_R-\Delta V}{E-V_{be_3}}\right] \qquad (5)$$

With the proper resistor ratios established for either of the amplifier configurations of FIGURES 1, 3 or 4, and noting that the forward base-emitter voltages of the transistors are all substantially equal, it can be shown that:

$$Vc=E-Ve+\Delta V \qquad (6)$$

where $Vc$=the quiescent direct current potential established at the collector electrode of the second transistor of the emitter coupled pair;

$Ve$=the quiescent direct current potential established at the emitter electrode of the second transistor of the pair;

and where E and ΔV are defined above. Stated another way, it can be shown that:

$$Vc-E_R=V_{be_3}+\Delta V \qquad (7)$$

where $Vc$, $E_R$, $V_{be_3}$ and ΔV are as previously defined.

What is claimed is:

1. A signal limiting circuit comprising:

a source of operating voltage;

an output terminal;

first and second transistors, each having base, emitter and collector electrodes and being energized from said source, with the base electrode of said second transistor being coupled for direct current flow to the collector electrode of said first transistor and with the emitter electrode of said second transistor being coupled to said output terminal by a first resistor which isolates said second transistor emitter electrode from the output capacitance of said circuit;

means including a second resistor connected to the collector electrode of said first transistor for connecting said first transistor as a signal translating circuit, and for establishing a first quiescent direct current potential at the collector electrode of said first transistor;

and means for applying signals to be translated between the emitter and base electrodes of said first transistor, said means including a third resistor for establishing a second quiescent direct current potential at the emitter electrode of said first transistor;

the ratio between said second and third resistors being such as to cause said first quiescent potential to reverse bias the collector-base junction of said first transistor by an amount substantially equal to the sum of the forward base-to-emitter voltage of said second transistor and the voltage developed across said first resistor by said signal translation.

2. A signal limiting circuit as defined in claim 1 wherein said first and second transistors and said first, second and third resistors are all disposed in a single integrated circuit.

3. A signal limiting circuit as defined in claim 1 wherein said third resistor is connected to the emitter electrode of said first transistor and wherein the ratio of said second resistor to said third resistor is given by the expression:

$$\frac{R_2}{R_3}=2\left[1-\frac{\Delta V}{E_R-V_{be}}\right]$$

where $R_2$=the resistance value of said second resistor;

$R_3$=the resistance value of said third resistor;

ΔV=the voltage developed across said first resistor;

$E_R$=the quiescent direct current potential existing at the base electrode of said first transistor; and $V_{be}$=the forward base-to-emitter voltage of said second transistor.

4. A signal limiting circuit as defined in claim 1 wherein said last mentioned means includes a third transistor having emitter and collector electrodes connected in a circuit path with the emitter electrode of said first transistor, and a base electrode coupled by said third resistor to said source of operating voltage, and wherein the ratio of said second resistor to said third resistor is given by the expression:

$$\frac{R_2}{R_3}=2\left[1-\frac{E_R+\Delta V}{E-V_{be}}\right]$$

where $R_2$=the resistance value of said second resistor;
$R_3$=the resistance value of said third resistor;
$\Delta V$=the voltage developed across said first resistor;
$E_R$=the quiescent direct current potential existing at the base electrode of said first transistor;
E=the value of said source of operating voltage; and
$V_{be}$=the forward base-to-emitter voltage of said second transistor.

5. A signal limiting circuit as defined in claim 1 wherein said third resistor is connected to the emitter electrode of said first transistor, wherein there is additionally included a fourth resistor coupling said output terminal to a point of reference potential for said first transistor emitter electrode, and wherein the ratio of said second resistor to said third resistor is given by the expression:

$$\frac{R_2}{R_3}=2\left[1-\frac{R_1}{R_4}\left(\frac{E_R}{E_R-V_{be}}\right)\right]$$

where $E_R$=the quiescent direct current potential existing at the base electrode of said first transistor;
$V_{be}$=the forward base-to-emitter voltage of said second transistor; and
$R_1$, $R_2$, $R_3$ and $R_4$=the resistance values of said first, second, third and fourth resistors, respectively.

6. A signal limiting circuit as defined in claim 1 wherein said last mentioned means includes a third transistor having emitter and collector electrodes connected in a circuit path with the emitter electrode of said first transistor, and a base electrode coupled by said third resistor to said source of operating voltage, wherein there is additionally included a fourth resistor coupling said output terminal to a point of reference potential for said first transistor emitter electrode, and wherein the ratio of said second resistor to said third resistor is given by the expression:

$$\frac{R_2}{R_3}=2\left[1-\frac{E_R\left(1+\frac{R_1}{R_4}\right)}{E-V_{be}}\right]$$

where $E_R$=the quiescent direct current potential existing at the base electrode of said first transistor;
E=the value of said source of operating voltage;
$V_{be}$=the forward base-to-emitter voltage of said second transistor; and
$R_1$, $R_2$, $R_3$ and $R_4$=the resistance value of said first, second, third and fourth resistors, respectively.

7. A signal translating circuit comprising:
first, second and third transistors, each having base, emitter and collector electrodes,
first and second terminals adapted to be connected to an operating potential supply source, and a third terminal adapted to be maintained at a potential intermediate to the potentials at said first and second terminals;
signal input circuit means connected to the base electrode of said first transistor;
a first resistor connected between the emitter electrodes of said first and second transistors and said first terminal;
a second resistor connected between the collector electrode of said second transistor and said second terminal;
a direct current connection from the collector electrode of said first transistor to said second terminal;
means connecting the base electrode of said second transistor to said third terminal;
a direct current connection from the collector electrode of said second transistor to the base electrode of said third transistor;
a direct current connection from the collector electrode of said third transistor to said second terminal;
third and fourth resistors serially connected in the order named between the emitter electrode of said third transistor and said first terminal, with said third resistor comprising the sole connection to said third transistor emitter electrode; and
signal output circuit means connected to the junction of said third and fourth resistors;
the ratio between said second resistor and said first resistor being given by the expression:

$$\frac{R_2}{R_1}=2\left[1-\frac{R_3}{R_4}\left(\frac{E_R}{E_R-V_{be}}\right)\right]$$

where $E_R$=the value of said intermediate potential maintained at said third terminal;
$V_{be}$=the forward base-to-emitter voltage of said third transistor; and
$R_1$, $R_2$, $R_3$ and $R_4$=the resistance value of said first, second, third and fourth resistors, respectively.

8. A signal translating circuit comprising:
first, second, third and fourth transistors, each having base, emitter and collector electrodes;
first and second terminals adapted to be connected to an operating potential supply source, and a third terminal adapted to be maintained at a potential intermediate to the potentials at said first and second terminals;
a direct current connection from the collector electrode of said first transistor to said first terminal;
a direct current connection from the collector electrode of said second transistor to the base electrode of said third transistor;
a direct current connection from the collector electrode of said third transistor to said first terminal;
a direct current connection from the emitter electrode of said fourth transistor to said second terminal;
a direct current connection from the collector electrode of said fourth transistor to the emitter electrodes of said first and second transistors;
signal input circuit means connected to the base electrode of said first transistor;
means connecting the base electrode of said second transistor to said third terminal;
a first resistor connected between the base electrode of said fourth transistor and said first terminal;
a second resistor connected between the collector electrode of said second transistor and said first terminal;
third and fourth resistors serially connected in the order named between the emitter electrode of said third transistor and said second terminal; and
signal output circuit means connected to the junction of said third and fourth resistors;
the ratio between said second resistor and said first resistor being given by the expression:

$$\frac{R_2}{R_1}=2\left[1-\frac{E_R\left(1+\frac{R_3}{R_4}\right)}{E-V_{be}}\right]$$

where $E_R$=the value of said intermediate potential maintained at said third terminal;
$V_{be}$=the forward base-to-emitter voltage of said third transistor;

E=the value of said operating potential source; and $R_1$, $R_2$, $R_3$ and $R_4$=the resistance value of said first, second, third and fourth resistors, respectively.

9. A signal translating circuit as defined in claim 8 wherein there is additionally included a temperature stabilizing diode having an anode electrode connected to the base electrode of said fourth transistor and a cathode electrode connected to the emitter electrode of said fourth transistor.

References Cited

UNITED STATES PATENTS 3,366,889 1/1968 Avins ---------------- 330—19

JOHN KOMINSKI, Primary Examiner

J. B. MULLINS, Assistant Examiner

U.S. Cl. X.R.

330—22, 38